United States Patent [19]

Hung

[11] 4,080,721

[45] Mar. 28, 1978

[54] FABRICATION OF SEMICONDUCTOR DEVICE

[75] Inventor: Roland Y. Hung, Somers, N.Y.

[73] Assignee: International Business Machines Corporation, Armonk, N.Y.

[21] Appl. No.: 591,996

[22] Filed: Jun. 30, 1975

[51] Int. Cl.² ............................................. B01J 17/00
[52] U.S. Cl. ...................................... 29/578; 29/590; 204/15; 357/91
[58] Field of Search ........................ 29/578, 589, 590; 357/91; 204/15

[56] References Cited

U.S. PATENT DOCUMENTS

| 3,515,956 | 6/1970 | Martin | 357/91 |
| 3,738,917 | 6/1973 | Spath | 204/15 |
| 3,929,589 | 12/1975 | Ermanis | 204/15 |

Primary Examiner—W. Tupman
Attorney, Agent, or Firm—Pollock, Vande Sande & Priddy

[57] ABSTRACT

A method for fabricating an indium antimonide semiconductor device which includes anodizing through a portion of the thickness of an indium antimonide substrate containing an active impurity of a first type; selectively ion implanting an active impurity of a second type into the indium antimonide substrate; annealing; providing for ohmic electrical contact between preselected regions of the indium antimonide substrate and subsequently applied electrical contacts; and depositing a plurality of electrical contacts, a predetermined number of which are in ohmic electrical contact with the preselected regions of the substrate to thereby provide the semiconductor device; and semiconductor device obtained thereby.

14 Claims, 5 Drawing Figures

FABRICATION OF SEMICONDUCTOR DEVICE

BACKGROUND OF THE INVENTION

The present invention is concerned with the fabrication of a semiconductor device of indium antimonide. The present invention is particularly concerned with the fabrication of MOSFET semiconductor devices and bipolar transistor devices from indium antimonide.

It has been known that indium antimonide is the highest mobility of the known semiconducting materials. Accordingly, indium antimonide has been considered as an interesting material for the fabrication of semiconductor devices.

One very important commercial type of semiconductor device is the MOSFET. Accordingly, the preparation of a MOSFET from indium antimonide would be desirable. However, MOSFETs have not been prepared from indium antimonide.

The failure to provide MOSFET devices from indium antimonide is believed to be due to the inability of the prior art to suggest a process which enables the preparation of a device having a combination of all of the necessary properties without adversely affecting any of the critical characteristics of the device.

For instance, it is essential in the preparation of a MOSFET, that an active doping impurity be introduced into only preselected local regions of the indium antimonide substrate while preventing its introduction into the substrate at undesired regions. In addition, is it essential that the technique of incorporating the impurity does not adversely affect the oxide layer, the substrate and especially the critical oxide layersubstrate interface. Furthermore, for the types of devices with which the present invention is concerned, it is important that the bond between the substrate and oxide be as intimate as possible.

Although there have been attempts to prepare certain bipolar devices from indium antimonide, these did not involve bipolar structures wherein all of the electrical contacts were located on the same surface of the substrate and which required an insulating layer. Accordingly, such prior structures could not be fabricated to provide LSI (large scale integration) devices. In addition, these prior attempts involved nonselective thermal diffusion of an impurity and are cumbersome to carry out.

It is therefore an object of the present invention to provide a method for fabricating indium antimonide semiconductor devices which provides for the important combination of introducing an active doping impurity into preselected defined regions of the substrate while preventing its introduction into undesired regions and without adversely affecting the oxide, substrate or oxide-substrate interface of the device, while also achieving an intimate bond between the substrate and oxide.

Another object of the present invention is to enable the preparation of such semiconductor devices in a manner which is both easy and efficient to carry out. Another object of the present invention is to provide a method for preparing such semiconductor materials which enables the preparation of semiconductor devices which have a high transconductance.

SUMMARY OF THE INVENTION

A process aspect of the present invention is concerned with a method for fabricating a semiconductor device which comprises:

(A) providing an indium antimonide substrate of a first conductive type containing an active impurity of a first type;

(B) anodizing the surface of the indium antimonide substrate through a portion of its thickness to provide an electrical insulating layer of anodized indium antimonide on the surface of the indium antimonide substrate;

(C) selectively ion implanting at a temperature between about $-200°$ C and about $100°$ C an active impurity of a second type into at least one preselected region of the indium antimonide substrate;

(D) annealing at a temperature between about $100°$ C and about $350°$ C subsequent to the ion implanting whereby the annealing temperature is higher than the ion implanting temperature;

(E) removing anodized material at preselected locations of the insulating layer to provide for ohmic electrical contact between preselected regions of the underlying indium antimonide substrate and subsequently applied electrical contacts, which preselected regions include at least one region which contains the ion implanted impurity of the second type; and (F) depositing a plurality of electrical contacts at preselected locations, wherein a predetermined number of the contacts is in ohmic electrical contact with the at least one preselected region of the underlying indium antimonide substrate which contains the ion implanted impurity of the second type to thereby provide the semiconductor device.

Another process aspect of the present invention is a method of fabricating a semiconductor device which comprises:

(A) providing an indium antimonide substrate of a first conductive type containing an active impurity of a first type;

(B) anodizing preselected portions of the surface of the indium antimonide substrate through a portion of its thickness while protecting from anodization preselected portions which are to form ohmic electrical contact with subsequently applied electrical contacts;

(C) ion implanting at a temperature between about $-200°$ C and about $100°$ C an active impurity of a second type into at least one preselected region of the indium antimonide substrate;

(D) annealing at a temperature between about $100°$ C and about $350°$ C whereby the annealing temperature is higher than the ion implanting temperature; and (E) depositing a plurality of electrical contacts at preselected locations, wherein a predetermined number of the contacts is in ohmic electrical contact with the at least one preselected region of the underlying indium antimonide substrate which contains the ion implanted impurity of the second type to thereby provide the semiconductor device.

The present invention is also concerned with semiconductor devices obtained by the above-described processes. Another aspect of the present invention is semiconductor device which comprises an indium antimonide substrate of a first conductive type containing an impurity of a first type and containing an ion implanted active impurity of a second type in at least one preselected region thereof; an insulating layer of anodized indium antimonide on top of the indium antimonide substrate, and a plurality of electrical contacts wherein a predetermined number of contacts is in ohmic electrical contact with the at least one preselected region of the underlying indium antimonide substrate which contains the ion implanted impurity of the second type.

DESCRIPTION OF PREFERRED EMBODIMENTS

Figure 1:
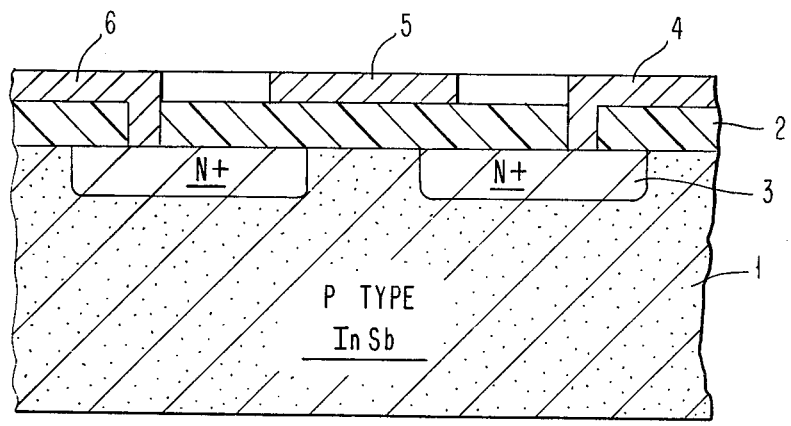
FIG. 1 is a cross-sectional view of a MOSFET device prepared according to the present invention.

The particular semiconductor devices which are fabricated according to the present invention are MOSFET and bipolar transistor devices. The substrate of the devices of the present invention is indium antimonide of a first conductive type containing an active doping impurity of a first type.

In discussing the semiconductor fabrication method, the usual terminology that is well known in the transistor field will be used herein. In discussing concentration, references will be made to majority or minority carriers. By "carrier" is signified the free-holes or electrons which are responsible for the passage of current through a semiconductor material. Majority carriers are used in reference to those carriers in the material under discussion, i.e., holes in P-type material or electrons in N-type material. By use of the terminology "minority carriers" it is intended to signify those carriers in the minority, i.e., holes in the N-type material on electrons in the P-type material. In the most common type of semi-conductor materials used in present day transistor structure, carrier concentration is generally due to the concentration of the "significant impurity". That is, impurities which impart conductivity characteristics to extrinsic semiconductor material.

Unless otherwise specified, when reference is made to an impurity of a "first type" and to an impurity of the "second type", it is understood that the "first type" refers to an N or P-type material and "second type" refers to the other material. That is, if the "first type" is P, then the "second type" is N. If the "first type" is N, then the "second type" is P. In referring to a region containing an impurity concentration of P-type, for instance, it is meant the "significant impurity" is a P-type and that the majority carriers are holes.

The indium antimonide semiconductor substrate of the first conductive type can be obtained by methods well known in the art for providing a semiconductor substrate, such as the Czochralski or Bridgeman methods.

A wafer of P-type conductivity or N-type conductivity preferably having a resistivity of about $10^{-2}$ to about $10^2$ ohms-centimeter is employed as the starting substrate. Exemplary of some P-type impurities include zinc, cadmium, magnesium, manganese, and mercury. Exemplary of some N-type impurities include lithium, tin, silicon, selinium, and tellurium. The specific thickness of the substrate is not particularly crucial to the present invention and can vary widely depending upon the final use of the semiconductor device and is primarily determined by economical and practical considerations. For convenience, the substrate can be from about 10 to about 50 mils thick.

The next step of the present invention is to provide an electrical insulating layer on the top surface of the indium antimonide substrate by anodizing the surface of the indium antimonide substrate through a portion of its thickness. The anodization makes it possible to provide an exceptionally high integrity interface between the oxide layer and substrate, which interface is important in the reliability and effectiveness of the types of semiconductor devices to which the present invention is addressed. The interface is extremely critical in a MOSFET since when a MOSFET is in operation, the actual current flow is extremely close to this interface. Accordingly, any defect in the interface can have a pronounced adverse affect upon the operability of the device.

Methods other than anodization do not form an interface between the oxide and semiconductor substrate of sufficient integrity as to prevent unfavorable operating characteristics.

The anodization is generally conducted so that the anodized indium antimonide layer is from about 200 to about 2,000 angstroms thick and preferably from about 500 to about 1,000 angstroms thick. The anodization can be carried out by various methods suggested heretofore including those disclosed by Hung et al in the Journal of Applied Physics, Vol. 41, No. 5, pp. 2185–89 (April 1970) and in Abstract No. 127, Anodic Oxidation of InSb, paper presented by Electrochemical Society Meeting, Detroit, Michigan (October 1969), disclosures of which are incorporated herein by reference. For instance, the indium antimonide can be anodized by employing anodization solutions such as 0.1 N KOH or 2 grams of $KNO_2$ dissolved in 100 ml of tetrahydrofurfuryl alcohol.

The anodization can be generally completed in about 5 to about 30 minutes and can be carried out using a constant current process or a constant voltage process. In a constant current method, usually the current is between about 0.5 milliamps/cm$^2$ to about 250 milliamps/cm$^2$. The temperature of the anodization can vary over a wide range and is most conveniently normal room temperatures. Also, it is important to carry out the anodization under a fixed condition of light since it has been reported that the anodization is light sensitive (i.e., see J. D. Venables et al, Journal Applied Physics, 30, 1110, 1959; and J. D. Venables et al, Journal Electrochem. Society, 107, p. 296, 1960). The use of yellow light is a convenient manner under which the anodization can be carried out.

The anodization can be carried out so that the entire surface of the indium antimonide substrate through only a portion of its thickness is anodized. Also, if desired, the anodization can be conducted so that only preselected portions of the indium antimonide substrate through a portion of its thickness are anodized while the remainder of the indium antimonide substrate is protected from anodization in portions which are to form subsequent desired ohmic electrical connections.

If preselected portions of the indium antimonide which are to form desired ohmic electrical connections are to be protected or masked from anodization, such methods are well known in the art and need not be described in great detail in this application. For example, a photoresist or electron beam sensitive composition can be applied to the substrate by conventional coating techniques such as spraying, dipping, spinning, and the like. The article is then exposed to the desired pattern and developed by conventional techniques including ultraviolet light, electron beam or x-ray beam techniques followed by removal of the exposed portions in the case of positive resist materials and unexposed portions in the case of negative resist materials by etching or dissolution in an appropriate liquid.

The compositions are selected so as not to be affected by the anodization process but at some later time can be removed or destroyed, for example, in the case of positive resists by use of ultraviolet light, electron beam and/or x-ray followed by etching or dissolution in an appropriate liquid. These, however, will not adversely affect the previously formed anodized indium antimonide layer.

It is preferred, according to the present invention, to anodize the entire surface of the indium antimonide substrate through a portion of its thickness. In this procedure, anodized material at preselected locations on the insulating layer is removed to provide for ohmic electrical contact between the preselected regions of the indium antimonide substrate and subsequently applied electrical contacts. This removal step can be carried out immediately after the anodization or subsequent to the ion implantation technique or subsequent to the annealing but prior to depositing the electrical contacts. The anodized material at the preselected locations can be removed by methods well known in the art and such need not be described in great detail in the present application.

For instance, a photoresist or electron beam sensitive composition can be applied to the anodized layer by conventional coating techniques such as spraying, dipping, spinning, and the like. The article is then exposed to the desired pattern and developed by known techniques such as ultraviolet light, electron beam or x-ray beam techniques followed by removal of the exposed portions in the case of positive resist materials and unexposed portions in the case of negative resist materials by etching or dissolution in an appropriate liquid. Next, the article can be baked if desired at temperatures of about 50 to about 100° C for about 5 to about 60 minutes to secure that the coating remains during the step of removing the preselected portions of the anodized material. Commercially available photoresist products are obtainable from Shipley Company, Inc., of Wessely, Massachusetts and Eastman Kodak Company of Rochester, New York. One particular commercially available material is Shipley Resist 1350 which according to the manufacturer is a metacresol formaldehyde novalak resin sensitized with 2-diazo-L-oxyl-naphthalene-5-sulfonic acid ester of 2,3,4-trihydroxybenzophenone.

After this, the anodized indium antimonide in the unprotected regions is removed by etching in a suitable composition which does not affect the coating but removes the anodized material. Exemplary of suitable etching solutions include aqueous solutions of hydrofluoric acid. The etching can be carried out at normal room temperatures for several minutes until the anodized material in the unprotected region is removed. Next the photoresist or electron beam sensitive masking material can be removed by methods known in the art such as dissolution or etching in a liquid which preferentially removes the photoresist or electron beam sensitive material without affecting anodized material or substrate.

An active impurity of a second type is selectively introduced into preselected regions of the indium antimonide substrate by ion implantation. The ion implantation is conducted at a temperature between about −200° C and about 100° C and preferably at normal room temperatures.

The depth to which the ions are implanted in the substrate is a function of the ion beam energy, the particular ion, and the angled incidents of the beam with respect to the substrate. Generally, an ion beam with energy of about 50 Kev to about 4 Mev is sufficient for implanting impurities in the substrate. Preferably the ion beam energy employed is from about 100 Kev to about 1 Mev. The ion implantation technique is usually continued to provide about $10^{19}$ to about $10^{20}$ of impurity atoms per $cm^3$ for source and drain regions of a MOSFET and emitter region of a bipolar device; and to provide about $10^{17}$ to about $10^{18}$ of impurity atoms per $cm^3$ for the base region of a bipolar device. This usually takes between about ½ and about 6 hours.

The apparatus employed to carry out the ion implantation can be those employed in the prior art such as that described in U.S. Pat. No. 3,770,516 to Duffy et al.

Various methods are available for controlling the area of implantation. The preferred method involves controlling the areas of implantation through the use of masking the substrate surface with a photoresist or electron beam sensitive material. By techniques well known in the art, a photoresist or electron beam sensitive material may be selectively applied to the surface of the water. The thickness of the photoresist layer to be applied over the areas of the substrate where ion implantation is not desired depends upon the energy of the ion beam. In addition, any material which may be laid in a thin film upon the surface of the wafer may be used to mask the areas of the wafer on the substrate which are not to be implanted. In the practice of the present invention, it is important to use a masking material which can be applied by relatively low temperatures to the substrate. Accordingly, it is preferred to employ photoresist or electron beam sensitive materials as the masking material. Temperatures which would heat the substrate above about 400° C should not be employed since such temperatures can adversely affect the anodized indium antimonide layer.

The use of ion implantation is important in the steps of the present invention since it can selectively implant the ions at predetermined locations without lateral displacement of the impurity. For instance, the use of thermal diffusion to incorporate the impurities into the indium antimonide substrate would result in diffusion of the impurity throughout the oxide layer and substrate to such an extent that the devices obtained would be virtually useless as semiconductors of the type to which this invention is concerned.

After the ion implantation, it is necessary to subject the device to an annealing process at temperatures between about 100 and about 350° C and preferably between about 200 and about 300° C. This annealing process is to correct structural defects which may have been created by the ion implantation. It is crucial that the temperature not be greater than about 400° C since relatively high temperatures destroy the anodized layer and thereby render the device unsuitable for the purpose of the present invention. The annealing can be carried out immediately after the ion implantation or subsequent to deposition of the electrical contacts. Moreover, when the contacts are sintered, the annealing can also be carried out prior to or simultaneously with or subsequent to the sintering.

Also, the annealing temperature must be above the temperature used during the ion implantation. The annealing is usually completed in about 15 to about 120 minutes. The time and temperature of the annealing are inversely related. For instance, when employing temperatures at the upper portion of the range, the time of the annealing will be at the lower portion of the time range.

A plurality of electrical contacts are deposited at preselected locations on the device. In addition, a predetermined number of the electrical contacts is to be in ohmic electrical contact with preselected regions of the substrate in order to provide the semiconductor device. These preselected regions include a region which contains the ion implanted impurities of the second type.

For instance, when preparing a MOSFET, the plurality of electrical contacts include a drain, a gate, and a source whereby the drain and source are in electrical contact with the region containing the second impurity in the indium antimonide substrate whereas the gate is not in ohmic contact with the substrate. FIG. 1 illustrates a MOSFET whereby the numeral 1 represents a P-type indium antimonide substrate, 2 represents anodized indium antimonide layer, 3 illustrates the N-type impurity regions in the substrate, 4 represents the source, 5 represents the gate, and 6 represents the drain.

When a bipolar device is prepared, the plurality of electric contacts are the emitter, base, and collector, all of which are in ohmic electrical contact with impurity regions of the device. The emitter and collector as shown in FIG. 2 are in electrical contact with a first type of impurity and the base is in ohmic electrical contact with a second type of impurity.

Figure 2:
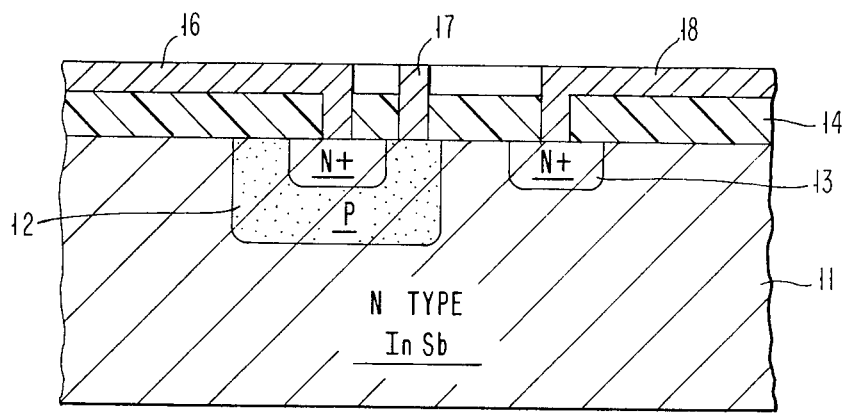
FIG. 2 is a cross-sectional view of a bipolar transistor device prepared according to the present invention.

FIG. 2 illustrates a typical bipolar transistor device wherein the numeral 11 represents an N-type indium antimonide substrate and 12 represents a P-type impurity. Numeral 13 represents an N-type impurity and 14 represents the anodized indium antimonide layer. Numeral 16 represents the emitter, 17 represents the base, and 18 represents the collector.

It is further noted that when a bipolar device is prepared, two ion implantation steps are required. A first ion implantation step involves ion implanting an impurity of the second type into a preselected region of the substrate followed by implantation of impurity of the first type into preselected regions of the substrate (emitter). The impurity in the collector region is provided when the substrate is initially provided.

The electrical contacts may be deposited in the preselected regions by various methods of coating well known in the art. For instance, the electrically conductive material can be deposited upon the device by such means as sputtering, vacuum evaporation coating, and chemical vapor decomposition and the like. The electrically conductive contacts can be obtained from any of the well known metals heretofore employed as contacts in semiconductive devices. For instance, some suitable contacts include metals such as gold and indium-cadmium alloys such as a 98% indium and 2% cadmium alloy. The thickness of the metal contact layer is generally from about 0.1 to about 5 microns and preferably from about 0.5 to about 1 micron.

The temperatures of the deposition of the metal contact and sintering of deposited metal should not be so high as to increase the temperature of the substrate above about 400° C to prevent damage to the anodized layer. Temperatures from about 20° C to about 100° C are generally employed for depositing the metal.

Although the figures merely show single enhancement mode devices, it is understood that LSI (large scale integration) devices can be made by the present process by following the steps defined herein and by providing a plurality of, for instance, source drains and gates for MOSFETs and emitters, bases, and collectors for bipolar devices. In addition, depletion-mode MOSFET, as well as multilayer devices can be prepared by the process as described.

Figure 3:
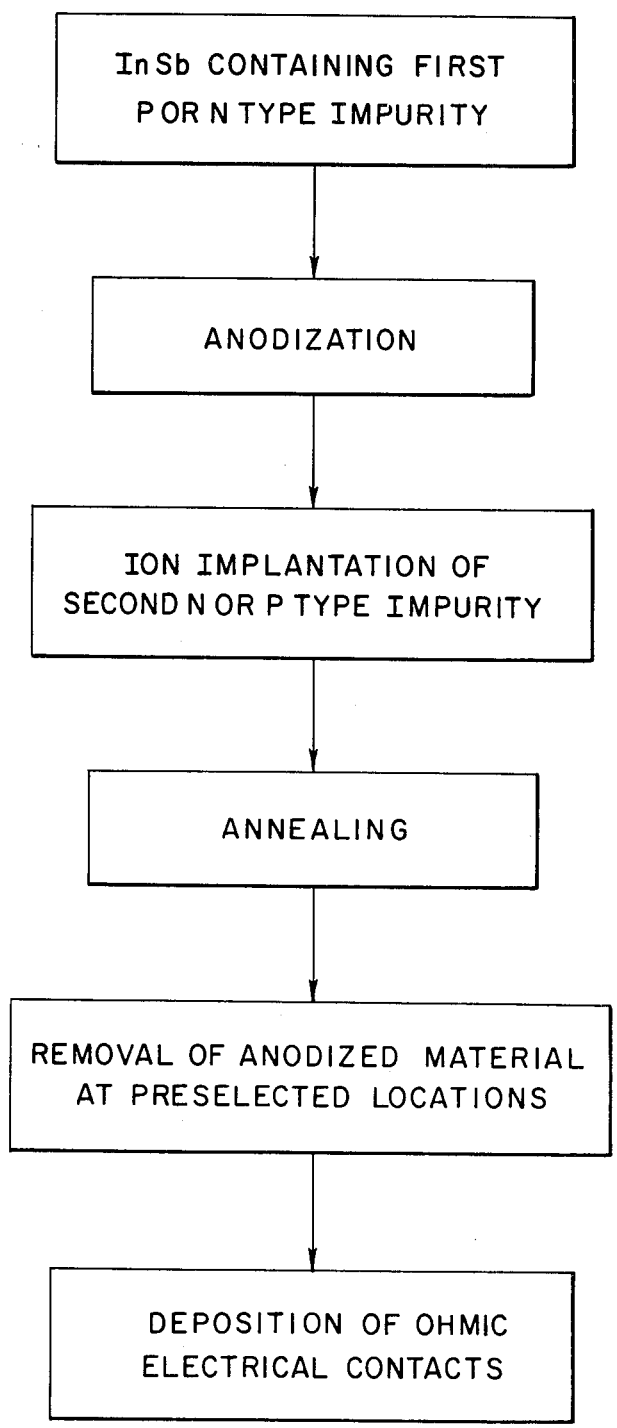
FIG. 3 is a block diagram illustrating one sequence of steps for carrying out the process of the present invention.

FIG. 3 illustrates one sequence of steps for carrying out the present invention which includes providing an indium antimonide substrate of a first conductive type containing an active impurity of a first type; then anodizing the surface of the indium antimonide substrate; then selectively ion implanting the active impurity of the second type; then annealing at a temperature between about 100° C and about 350° C; then removing anodized indium antimonide at preselected locations; and then depositing the plurality of electrical contacts.

Figure 4:
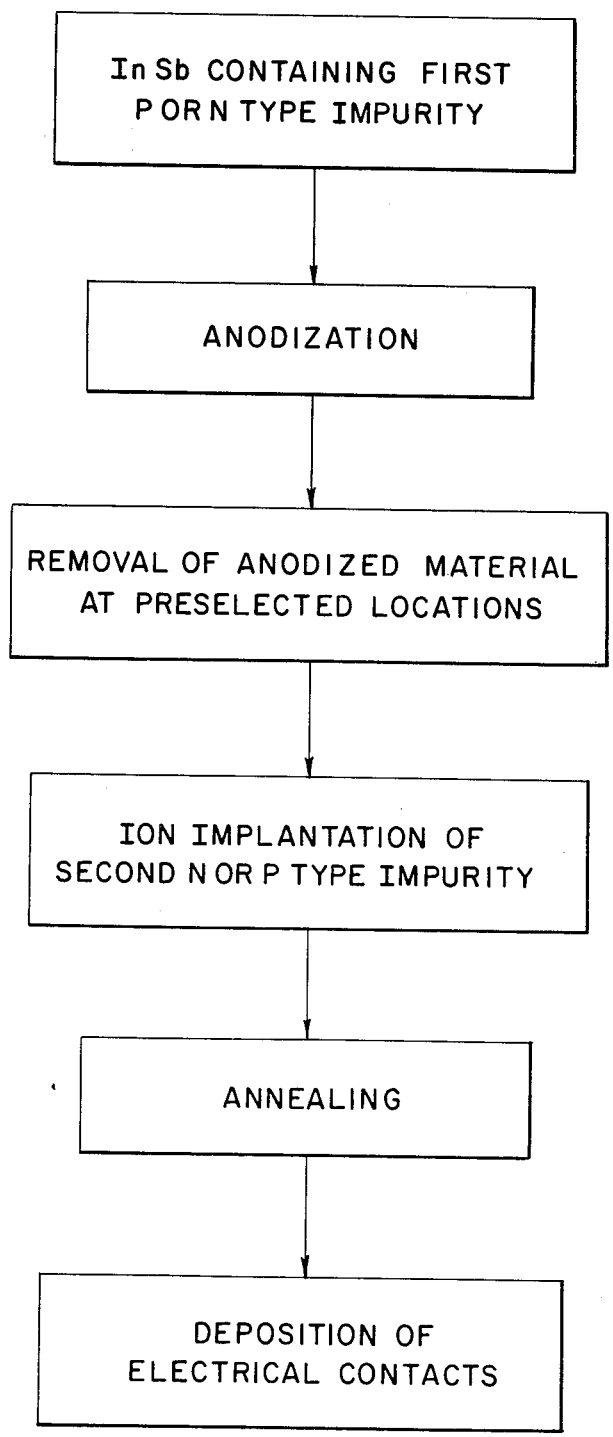
FIG. 4 is a block diagram of another sequence of steps for carrying out the process of the present invention.

FIG. 4 illustrates another sequence of steps suitable for carrying out the present invention which differs from the sequence illustrated in FIG. 3 in that the step of removing the anodized indium antimonide at the preselected locations is carried out prior to the ion implanting step.

Figure 5:
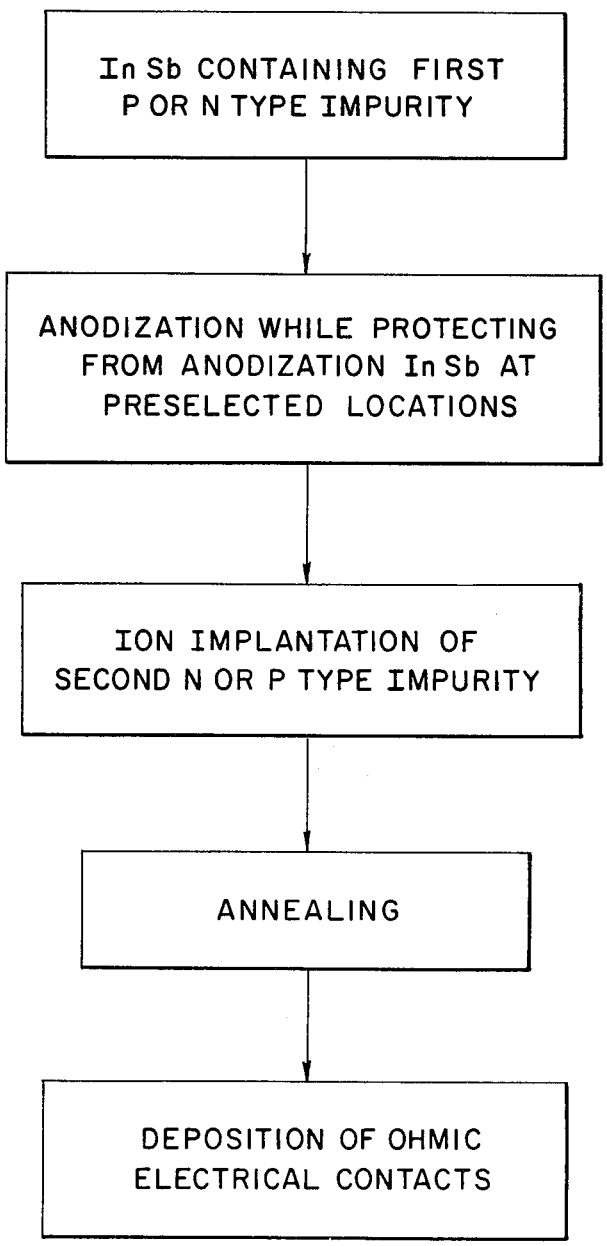
FIG. 5 is a block diagram of still another sequence of steps for carrying out the process of the present invention.

FIG. 5 illustrates yet another sequence of steps which includes providing the indium antimonide substrate of a first conductive type containing an active impurity of a first type; then anodizing preselected portions while protecting from anodization preselected portions which are to form ohmic electrical contact with subsequently applied electrical contacts; then ion implanting the active impurity of the second type; and then annealing followed by depositing the plurality of electrical contacts.

What is claimed is:

1. A method of fabricating a semiconductor device which comprises:
(A) providing an indium antimonide substrate of a first conductive type containing an active impurity of a first type;
(B) anodizing the surface of said indium antimonide substrate through a portion of its thickness to provide an electrical insulating layer of anodized indium antimonide on the top surface of the indium antimonide substrate;
(C) selectively ion implanting at a temperature between about −200° C and about 100° C active impurity of a second type into at least one preselected region of the indium antimonide substrate;
(D) annealing at a temperature between about 200° C and about 300° C subsequent to ion implanting whereby the annealing temperature is higher than the ion implantation temperature for about 15 minutes to about 120 minutes;
(E) removing the anodized material at preselected locations on the insulating layer to provide for ohmic electrical contact between preselected regions of the underlying indium antimonide substrate, and subsequently applied electrical contacts, which preselected regions include said at least one region which contains the ion implanted impurity of the second type; and (F) depositing a plurality of electrical contacts at preselected locations, a predetermined number of which is in ohmic electrical contact with said at least one preselected region of said substrate which contains the ion implanted impurities of the second type to provide said semiconductor device.

2. The method of claim 1 wherein the ion implanting is carried out at normal room temperature.

3. The method of claim 1 which further includes sintering the electrical contacts after deposition.

4. The method of claim 1 wherein the annealing is carried out prior to the removing of the anodized material at preselected locations.

5. The method of claim 1 wherein the annealing is carried out subsequent to the removal of the anodized material at preselected locations.

6. The method of claim 1 wherein the annealing is carried out after the deposition of the electrical contacts.

7. The method of claim 1 wherein said semiconductor device is a MOSFET; said plurality of electrical contacts include a source, drain, and gate wherein said source and drain are in ohmic electrical contact with preselected regions of the underlying indium antimonide substrate which contain ion implanted impurity of the second type.

8. The method of claim 1 wherein said semiconductor device is a bipolar transistor device, and further includes ion implanting at a temperature between about −200° C and about 100° C, an active impurity of the first type into preselected regions of the substrate subsequent to the ion implanting of the impurity of the second type; said plurality of electrical contacts include an emitter, base, and collector wherein the base is in ohmic electrical contact with the region of the underlying indium antimonide substrate which contains ion implanted impurity of the second type and wherein the emitter and collector are in ohmic electrical contact with the regions of the underlying indium antimonide substrate which contains ion implanted impurity of the first type.

9. A method of fabricating a semiconductor device which comprises:

(A) providing an indium antimonide substrate of a first conductive type containing an active impurity of a first type;

(B) anodizing preselected portions of the surface of the indium antimonide substrate through a portion of its thickness while protecting from anodization preselected portions which are to form desired ohmic electrical connections with subsequently applied electrical contacts;

(C) ion implanting at a temperature between about −200° C and about 100° C active impurity of a second type into at least one preselected region of the indium antimonide substrate;

(D) annealing at a temperature between about 200° C and about 300° C, whereby the annealing temperature is greater than the ion implantation temperature for about 15 minutes to about 120 minutes; and (E) depositing a plurality of electrodes at preselected locations, a predetermined number of which is in ohmic electrical contact with the at least one preselected region of the underlying indium antimonide which contains the ion implanted impurity of the second type substrate to thereby provide said semiconductor device.

10. The method of claim 9 wherein the ion implanting is carried out at normal room temperature.

11. The method of claim 9 which further includes sintering the electrical contacts after deposition.

12. The method of claim 9 wherein the annealing is carried out after the deposition of the electrical contacts.

13. The method of claim 9 wherein said semiconductor device is a MOSFET; said plurality of electrical contacts include a source, drain, and gate wherein said source and drain are in ohmic electrical contact with preselected regions of the underlying indium antimonide substrate which contains ion implanted impurity of the second type.

14. The method of claim 9 wherein said semiconductor device is a bipolar transistor device, and further includes ion implanting at a temperature between about −200° C and about 100° C, an active impurity of the first type into preselected regions of the substrate subsequent to the ion implanting of the impurity of the second type; said plurality of electrical contacts include an emitter, base, and collector wherein the base is in ohmic electrical contact with the region of the underlying indium antimonide substrate which contains ion implanted impurity of the second type and wherein the emitter and collector are in ohmic electrical contact with the regions of the underlying indium antimonide substrate which contains ion implanted impurity of the first type.

* * * * *

UNITED STATES PATENT AND TRADEMARK OFFICE
CERTIFICATE OF CORRECTION

PATENT NO. : 4,080,721
DATED : March 28, 1978
INVENTOR(S) : Roland Y. Hung

It is certified that error appears in the above-identified patent and that said Letters Patent are hereby corrected as shown below:

Column 1, line 9, after "mobility" insert -- material --.

Column 1, line 28, change "is it" to -- it is --.

Column 1, line 35, change "layersubstrate" to -- layer substrate --.

Column 6, line 35, change "water" to -- wafer --.

*Signed and Sealed this*

*Twenty-ninth* Day of *August 1978*

[SEAL]

Attest:

RUTH C. MASON
*Attesting Officer*

DONALD W. BANNER
*Commissioner of Patents and Trademarks*